United States Patent
Lee et al.

(10) Patent No.: US 10,403,673 B2
(45) Date of Patent: Sep. 3, 2019

(54) IMAGE SENSORS

(71) Applicant: Samsung Electronics Co., Ltd., Suwon-si, Gyeonggi-do (KR)

(72) Inventors: Gwi-Deok Ryan Lee, Suwon-si (KR); Taeyon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 7 days.

(21) Appl. No.: 15/641,423

(22) Filed: Jul. 5, 2017

(65) Prior Publication Data
US 2018/0190708 A1  Jul. 5, 2018

(30) Foreign Application Priority Data
Dec. 29, 2016  (KR) .................. 10-2016-0182655

(51) Int. Cl.
*H01L 27/146* (2006.01)

(52) U.S. Cl.
CPC .. *H01L 27/14647* (2013.01); *H01L 27/14636* (2013.01); *H01L 27/14689* (2013.01); *H01L 27/14627* (2013.01)

(58) Field of Classification Search
CPC ......... H01L 21/8232; H01L 21/823406; H01L 27/14636; H01L 27/105; H01L 27/1057; H01L 29/762; H01L 29/765; H01L 29/768; H01L 29/76816; H01L 27/14647; H01L 27/14689; H01L 27/14627
USPC ...................................................... 257/440
See application file for complete search history.

(56) References Cited

U.S. PATENT DOCUMENTS

| 7,364,960 | B2 | 4/2008 | Lyu |
| 7,535,037 | B2 | 5/2009 | Lyu |
| 7,749,831 | B2 | 7/2010 | Lyu |
| 8,614,759 | B2* | 12/2013 | Akidai et al. |
| 8,648,362 | B2 | 2/2014 | Nakamura |
| 8,716,769 | B2 | 5/2014 | Ihara et al. |
| 8,736,735 | B2 | 5/2014 | Shinohara |
| 8,792,035 | B2 | 7/2014 | Yamada |
| 8,823,070 | B2 | 9/2014 | Hisanori |
| 9,129,881 | B2 | 9/2015 | Kawamura |
| 9,570,489 | B2 | 2/2017 | Kido et al. |
| 2007/0131987 | A1 | 6/2007 | Kim |
| 2012/0199882 | A1* | 8/2012 | Shin .................. H01L 27/14607 257/222 |

(Continued)

FOREIGN PATENT DOCUMENTS

| KR | 20000046221 A | 7/2000 |
| KR | 20010028859 A | 4/2001 |

*Primary Examiner* — Marc Anthony Armand
*Assistant Examiner* — Sue Tang
(74) *Attorney, Agent, or Firm* — Harness, Dickey & Pierce, P.L.C.

(57) ABSTRACT

An image sensor includes a transfer gate including a gate buried portion extending into a semiconductor substrate from a surface of the semiconductor substrate, a plurality of photoelectric conversion parts that are disposed in the semiconductor substrate on a side of the gate buried portion and vertically overlap each other, and a plurality of floating diffusion parts that are apart from and vertically overlap each other in the semiconductor substrate on other side of the gate buried portion, wherein at least one of the floating diffusion parts is positioned at a height of at least one of corresponding photoelectric conversion parts.

19 Claims, 23 Drawing Sheets

(56) References Cited

U.S. PATENT DOCUMENTS

| | | | |
|---|---|---|---|
| 2013/0015513 A1* | 1/2013 | Kido | H01L 27/1461 257/292 |
| 2013/0146747 A1* | 6/2013 | Hynecek | H01L 27/1464 250/208.1 |
| 2014/0252420 A1 | 9/2014 | Yi et al. | |
| 2016/0093659 A1 | 3/2016 | Nakamura et al. | |

* cited by examiner

IMAGE SENSORS

CROSS-REFERENCE TO RELATED APPLICATIONS

This U.S. non-provisional patent application claims priority under 35 U.S.C. § 119 to Korean Patent Application No. 10-2016-0182655 filed on Dec. 29, 2016, the entire contents of which are hereby incorporated by reference.

BACKGROUND

The example inventive concepts relate to an image sensor, and more particularly, to an image sensor including a multi-layered photoelectric conversion part.

An image sensor is a semiconductor device typically configured to transform optical images into electrical signals. The image sensor may be classified into a CCD (Charge Coupled Device) type and a CMOS (Complementary Metal Oxide Semiconductor) type. A CIS (CMOS image sensor) is an abbreviated name of the CMOS type image sensor. The CIS has a plurality of two-dimensionally arranged pixels. Each of, or at least one of the pixels includes a photodiode (PD). The photodiode is typically configured to transform an incident light into an electrical signal.

SUMMARY

Embodiments of the inventive concepts provide an image sensor in which a single pixel can simultaneously or contemporaneously sense lights having various wavelength ranges.

According to example embodiments of the example inventive concepts, an image sensor may include a transfer gate including a gate buried portion extending into a semiconductor substrate from a surface of the semiconductor substrate, a plurality of photoelectric conversion parts that are disposed in the semiconductor substrate on a side of the gate buried portion and vertically overlap each other, or overlap each other in a direction perpendicular to the surface of the semiconductor substrate, and a plurality of floating diffusion parts that are apart from and vertically overlap each other in the semiconductor substrate on other side of the gate buried portion, wherein each of, or at least one of the floating diffusion parts is positioned at a height of each of, or at least one of corresponding photoelectric conversion parts.

Example embodiments relate to an image sensor that includes a semiconductor substrate, a transfer gate on the semiconductor substrate, a plurality of photoelectric conversion parts in the semiconductor substrate and overlapping each other in a first direction perpendicular to a surface of the semiconductor substrate, a plurality of floating diffusion parts overlapping each other in the semiconductor substrate in the first direction, and a plurality of channel regions between the plurality of floating diffusion parts and the plurality of photoelectric conversion parts, the transfer gate overlapping the channel regions in the first direction.

DETAILED DESCRIPTION

It will be hereinafter described in detail example embodiments of the example inventive concepts in conjunction with the accompanying drawings.

Figure 1:
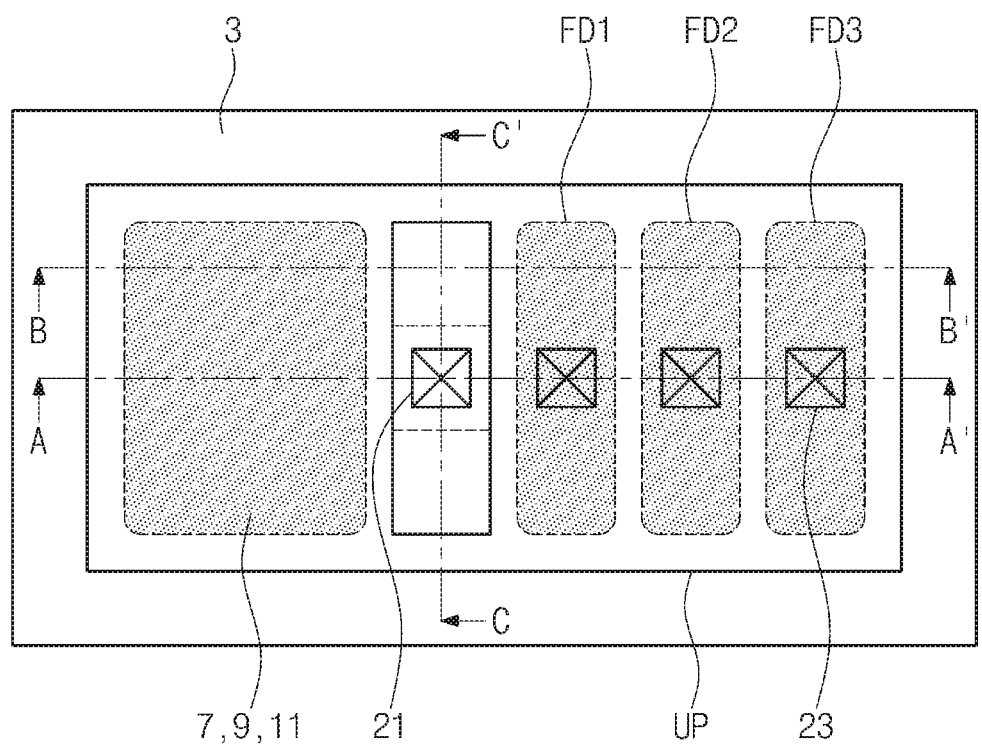
FIG. 1 is a plan view of an image sensor according to example embodiments of the example inventive concepts.
Figure 2:
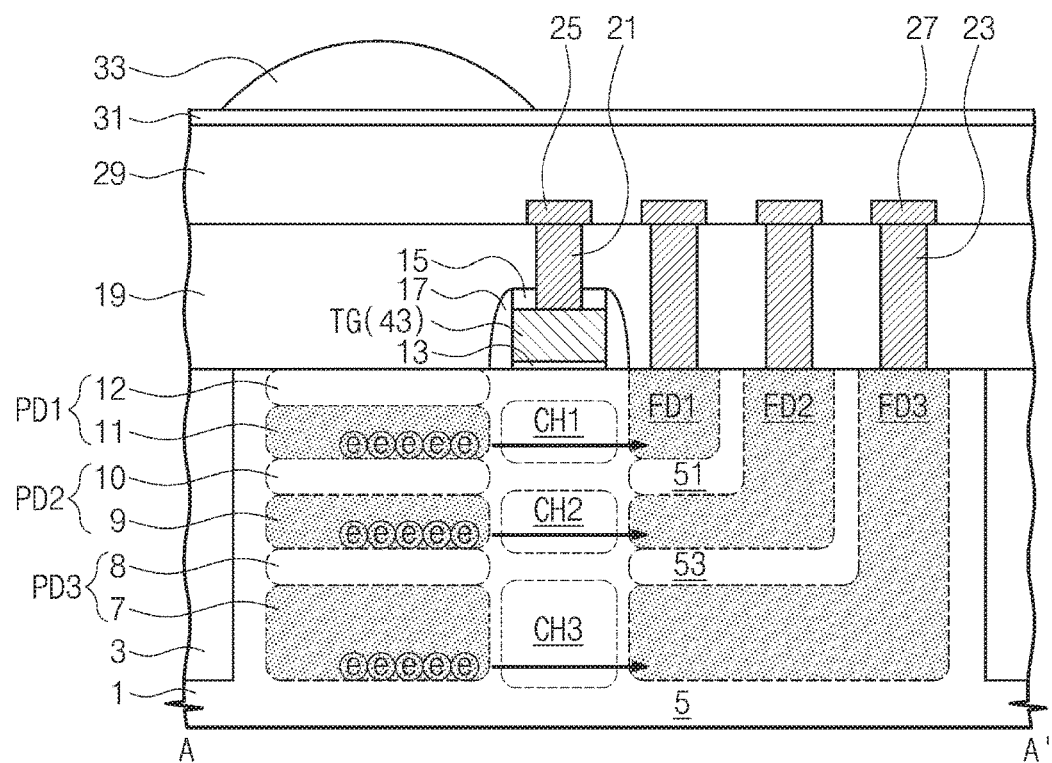
FIG. 2 is a cross-sectional view taken along line A-A' of FIG. 1 according to example embodiments of the example inventive concepts.
Figure 3:
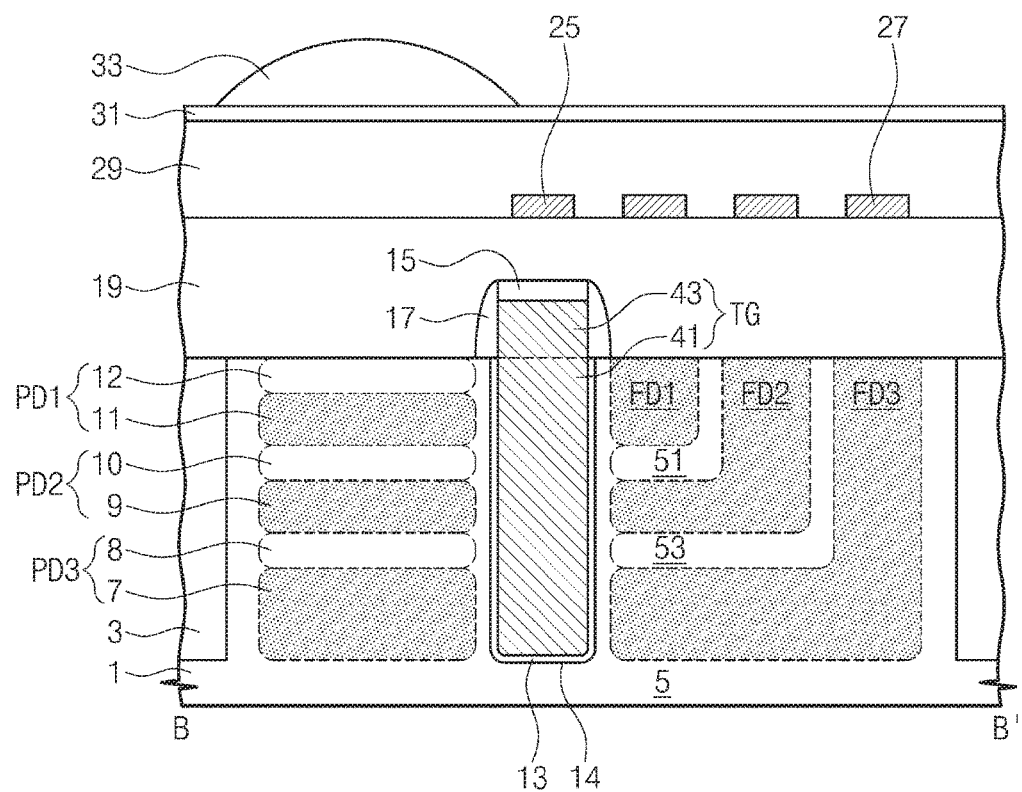
FIG. 3 is a cross-sectional view taken along line B-B' of FIG. 1 according to example embodiments of the example inventive concepts.
Figure 4:
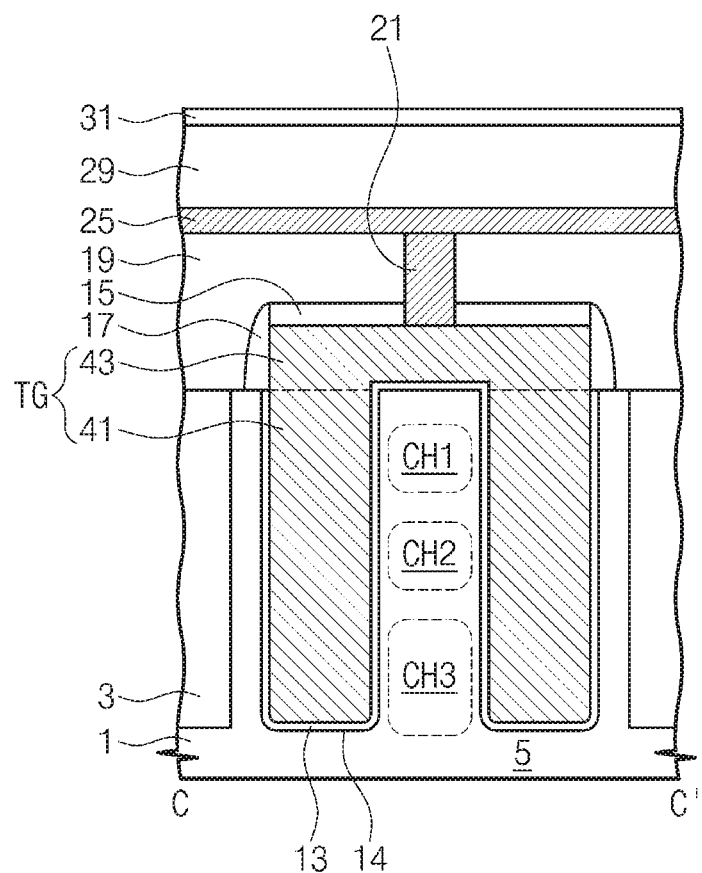
FIG. 4 is a cross-sectional view taken along line C-C' of FIG. 1 according to example embodiments of the example inventive concepts.
Figure 5:
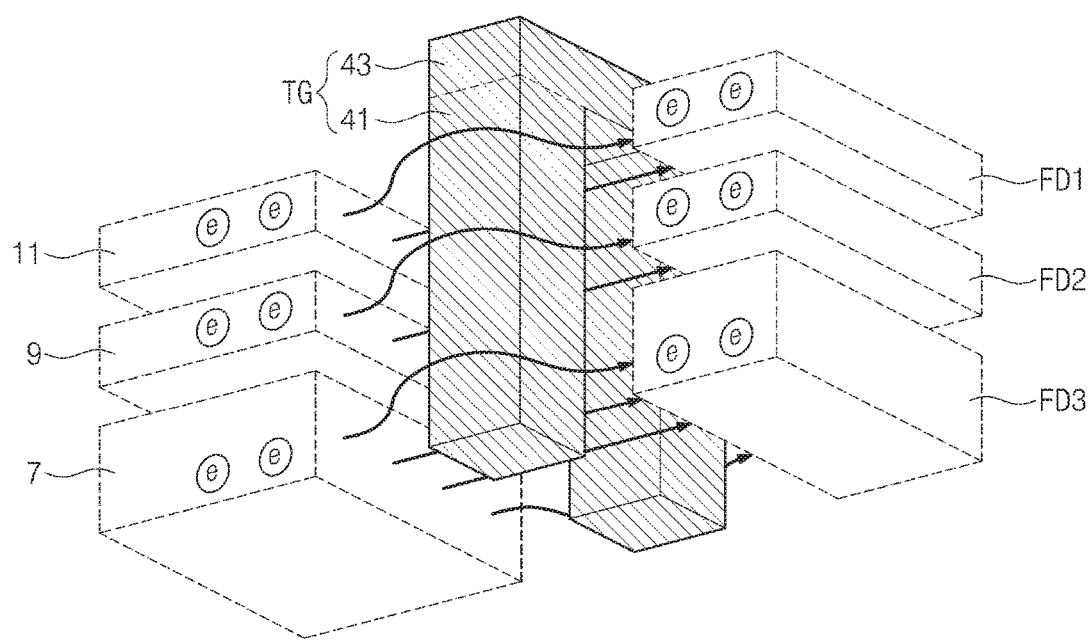
FIG. 5 is a partial perspective view of an image sensor according to example embodiments of the example inventive concepts.

FIG. 1 is a plan view of an image sensor according to example embodiments of the example inventive concepts. FIG. 2 is a cross-sectional view taken along line A-A' of FIG. 1 according to example embodiments of the example inventive concepts. FIG. 3 is a cross-sectional view taken along line B-B' of FIG. 1 according to example embodiments of the example inventive concepts. FIG. 4 is a cross-sectional view taken along line C-C' of FIG. 1 according to example embodiments of the example inventive concepts. FIG. 5 is a partial perspective view of an image sensor according to example embodiments of the example inventive concepts.

Referring to FIGS. 1 to 5, an image sensor 101 may include a semiconductor substrate 1 having a plurality of unit pixel regions UP. FIG. 1 shows that a single unit pixel region UP. The semiconductor substrate 1 may be, for example, a single crystalline silicon substrate. The semiconductor substrate 1 may be provided therein with a well region 5 doped with a first conductivity impurity. The first conductivity may be, for example, a P-type, and the well region 5 may be doped with boron. The semiconductor substrate 1 may be provided therein with a device isolation layer 3, which may define active regions of the unit pixel regions UP.

A transfer gate TG may be disposed on the semiconductor substrate 1. The transfer gate TG may include a gate protrusion portion 43 on the semiconductor substrate 1 and a gate buried portion 41 extending into the semiconductor substrate 1 from the gate protrusion portion 43. In some example embodiments, two gate buried portions 41 may be connected to opposite ends of the gate protrusion portion 43. As such, the transfer gate TG may have a reversed "U" shape. The two gate buried portions 41 may be disposed on opposite sides of each of, or at least one of channel regions CH1 to CH3 that are generated when voltage is applied, such that the channel regions CH1 to CH3 may be easily formed to enhance charge transfer efficiency and speed in comparison with the case that the gate buried portion 41 is provided in single. A gate dielectric layer 13 may be interposed between the transfer gate TG and the semiconductor substrate 1. The gate buried portion 41 may be disposed in a recess 14 of the semiconductor substrate 1.

First to third photoelectric conversion parts PD1 to PD3 may be provided to vertically overlap each other in the semiconductor substrate 1 on a side of the gate buried portion 41. The photoelectric conversion parts PD1 to PD3 may include corresponding regions 7, 9, and 11 each of, or at least one of which is doped with an impurity which conductivity is opposite to the conductivity of the well region 5. In detail, the first photoelectric conversion part PD1 may include a first impurity region 11, the second photoelectric conversion part PD2 may include a second impurity region 9, and the third photoelectric conversion part PD3 may include a third impurity region 7. The first to third impurity regions 11, 9, and 7 may be doped with, for example, an N-type impurity such as phosphorus or arsenic. Each of, or at least one of the first to third impurity regions 11, 9, and 7 may combine with its neighboring well region 5 to form a PN junction, and thus the first to third photoelectric conversion parts PD1 to PD3 may be achieved with the first to third impurity regions 11, 9, and 7. For example, the first to third photoelectric conversion parts PD1 to PD3 may be achieved only with the first to third impurity regions 11, 9, and 7.

The first to third photoelectric conversion parts PD1 to PD3 may further include corresponding regions 8, 10, and 12 each of, or at least one of which is doped with an impurity which conductivity is the same as the conductivity of the well region 5. In detail, the first photoelectric conversion part PD1 may further include a first additional impurity region 12 in addition to the first impurity region 11. The second photoelectric conversion part PD2 may further include a second additional impurity region 10 in addition to the second impurity region 9. The third photoelectric conversion part PD3 may further include a third additional impurity region 8 in addition to the third impurity region 7. The first to third additional impurity regions 12, 10, and 8 may be doped with a P-type impurity such as boron. A doped impurity concentration may be higher in the first to third additional impurity regions 12, 10, and 8 than in the well region 5. The first to third impurity regions 11, 9, and 7 may be positioned at different depths corresponding to penetration depths of light having blue, green, and red wavelength ranges, respectively.

First to third floating diffusion parts FD1 to FD3 may be apart from each other. The first to third floating diffusion parts FD1 to FD3 may be impurity-doped regions in the semiconductor substrate 1. The first to third floating diffusion parts FD1 to FD3 may be provided to vertically overlap each other in the semiconductor substrate 1 on other side of the gate buried portion 41. The number of the floating diffusion parts FD1 to FD3 may be the same as the number of photoelectric conversion parts PD1 to PD3. The first to third floating diffusion parts FD1 to FD3 may be doped with an impurity which conductivity is the same as the conductivity of the first to third impurity regions 11, 9, and 7. For example, the first to third floating diffusion parts FD1 to FD3 may be doped with an N-type impurity such as phosphorous or arsenic. Separation regions 51 and 53 may be provided to separate the first to third floating diffusion parts FD1 to FD3 from each other. The separation regions 51 and 53 may be doped with an impurity which conductivity is opposite to the conductivity of the first to third floating diffusion parts FD1 to FD3.

The first to third floating diffusion parts FD1 to FD3 may be positioned at different heights corresponding to heights of the first to third photoelectric conversion parts PD1 to PD3, respectively. In detail, the first to third impurity regions 11, 9, and 7 may have their bottom surfaces positioned at the same height as bottom surfaces of the first to third floating diffusion parts FD1 to FD3, respectively. That is, the first impurity region 11 may have the bottom surface at the same height as the bottom surface of the first floating diffusion part FD1. The second impurity region 9 may have the bottom surface at the same height as the bottom surface of the second floating diffusion part FD2. The third impurity region 7 may have the bottom surface at the same height as the bottom surface of the third floating diffusion part FD3.

Each of, or at least one of the second and third floating diffusion parts FD2 and FD3 may have an L-shaped section. The first to third floating diffusion parts FD1 to FD3 may have their top ends, which are positioned at a surface of the semiconductor substrate 1 and laterally spaced apart from each other. The gate buried portion 41 may extend between the third floating diffusion part FD3 and the third impurity region 7 of the third photoelectric conversion part PD3 that are provided at the lowermost position.

The gate protrusion portion 43 on the semiconductor substrate 1 may have top and side surfaces that are respectively covered with a capping pattern 15 and a spacer 17. The semiconductor substrate 1 may be covered with a first interlayer dielectric layer 19. The transfer gate TG may be electrically connected to a gate contact plug 21 that penetrates the first interlayer dielectric layer 19 and the capping pattern 15. The first to third floating diffusion parts FD1 to FD3 may be electrically connected to corresponding FD contact plugs 23 that penetrate the first interlayer dielectric layer 19. The gate contact plug 21 and the FD contact plugs 23 may include one or more of an impurity-doped polysilicon pattern, a titanium layer, a titanium nitride layer, a tantalum layer, a tantalum nitride layer, and a tungsten layer. The first interlayer dielectric layer 19 may be provided thereon with a transfer gate line 25 electrically connected to the gate contact plug 21 and also with FD lines 27 electrically connected to corresponding FD contact plugs 23. A second interlayer dielectric layer 29 and a passivation layer 31 may be stacked, for example sequentially stacked on the first interlayer dielectric layer 19. The first and second interlayer dielectric layers 19 and 29 may be formed of or include silicon oxide-based material. The passivation layer 31 may be formed of or include silicon nitride or polyimide. As not shown in figures, planarization layers may further be disposed on above and below the passivation layer 31. The passivation layer 31 may be provided thereon with a microlens 33 at a position overlapping the photoelectric conversion parts PD1 to PD3.

Figure 6:
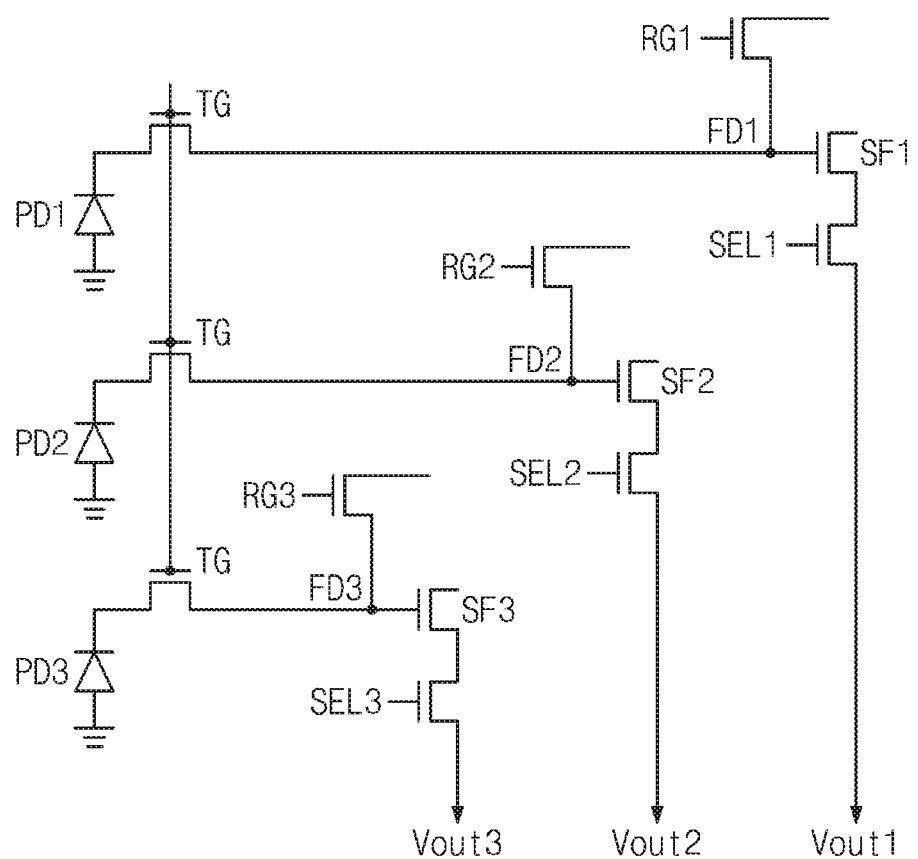
FIG. 6 is a circuit diagram of an image sensor according to example embodiments of the example inventive concepts.

FIG. 6 is a circuit diagram illustrating an image sensor according to example embodiments of the example inventive concepts.

Referring to FIGS. 1 to 6, in an image sensor according to embodiments of the example inventive concepts, a single unit pixel region UP may be provided thereon with a plurality of photoelectric conversion parts PD1, PD2, and PD3 each of, or at least one of which is connected to a side of a corresponding transfer transistor including a single transfer gate TG. Each of, or at least one of a plurality of floating diffusion parts FD1, FD2, and FD3 may be connected to other side of a corresponding transfer transistor. Reset gates RG1, RG2, and RG3 may be provided in corresponding reset transistors which source regions are called the floating diffusion parts FD1, FD2, and FD3. Each of, or at least one of the floating diffusion parts FD1, FD2, and FD3 may be connected to its corresponding one of source follower gates SF1, SF2, and SF3. Source follower transistors including the source follower gates SF1, SF2, and SF3 may be connected to corresponding select transistors including select gates SEL1, SEL2, and SEL3.

No color filters may be used or required in an image sensor according to example embodiments of the example inventive concepts. Accordingly, light with all wavelength ranges may be incident onto the unit pixel region UP of an image sensor according to embodiments of the example inventive concepts. The photoelectric conversion parts PD1 to PD3 may be disposed at penetration depths of light with all wavelength ranges such that light may be sensed at each wavelength. The followings are operation of an image sensor according to embodiments of the example inventive concepts. First, a voltage may be applied to the reset gates RG1 to RG3 under a light-blocked state such that the reset transistors may be turned on to discharge charges remaining on the floating diffusion parts FD1 to FD3. Thereafter, when the reset transistors are turned off and external light with all wavelength ranges is incident onto the photoelectric conversion parts PD1 to PD3, electron-hole pairs may be generated from each of, or at least one of the photoelectric conversion parts PD1 to PD2 in accordance with an amount (energy) of received light. In the photoelectric conversion parts PD1 to PD3, holes may be transferred to and accumulated on a P-type region and electrons may be transferred to and accumulated on an N-type region. When a voltage is applied to a single transfer gate TG, the transfer transistor may be turned on to generate first to third channel regions CH1 to CH3 around the gate buried portion 41. The channel regions CH1 to CH3 may be generated between the gate buried portions 41. The channel regions CH1 to CH3 may be apart from each other. The channel regions CH1 to CH3 may vertically overlap each other. That is, the first channel region CH1 may be formed between the first floating diffusion part FD1 and the first impurity region 11 of the first photoelectric conversion part PD1. The second channel region CH2 may be formed between the second floating diffusion part FD2 and the second impurity region 9 of the second photoelectric conversion part PD2. The third channel region CH3 may be formed between the third floating diffusion part FD3 and the third impurity region 7 of the third photoelectric conversion part PD3. As such, electrons generated from the first photoelectric conversion part PD1 may horizontally move along an arrow to the first floating diffusion part FD1 through the first channel region CH1. Electrons generated from the second photoelectric conversion part PD2 may move through the second channel region CH2 to the second floating diffusion part FD2. Electrons generated from the third photoelectric conversion part PD3 may move through the third channel region CH3 to the third floating diffusion part FD3. This may lead to change bias of each of, or at least one of the source follower gates SF1 to SF3, and thus the source follower transistors including the source follower gates SF1 to SF3 may have changed source potentials. At this time, when the select transistors including the select gates SEL1 to SEL3 are turned on, electrons may be read out as signals transmitted through column lines.

The single unit pixel region UP may therefore sense lights having various wavelength ranges at the same time. In addition, a single transfer gate TG protruding into the substrate 1 may be used to concurrently transfer light signals of various wavelength ranges, thereby enhancing operating speed and enabling high integration due to no need of a plurality of transfer gates.

FIGS. 7 to 12 are cross-sectional views illustrating a method of fabricating an image sensor having the cross-section of FIG. 2.

Figure 7:
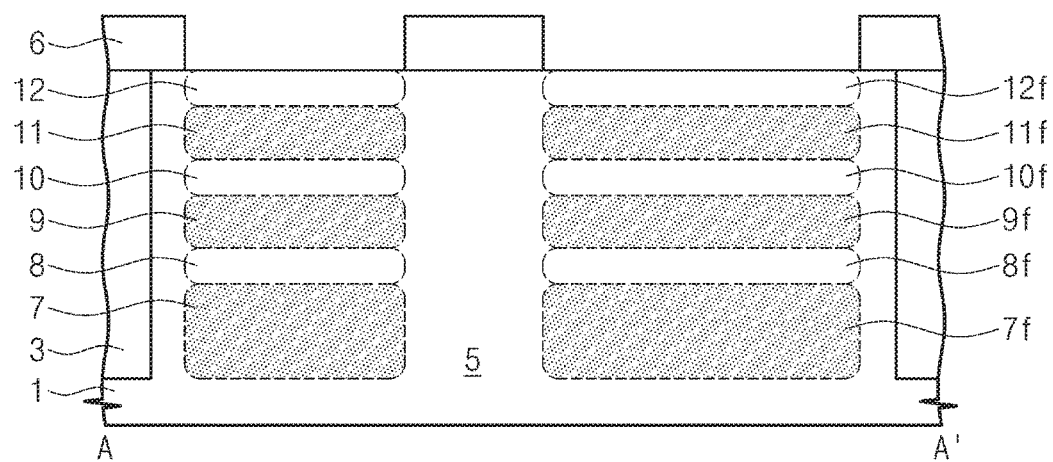
FIGS. 7 to 12 are cross-sectional views illustrating a method of fabricating an image sensor having the cross-section of FIG. 2.

Referring to FIGS. 1 and 7, an ion implantation process may be performed to form a well region 5 in a semiconductor substrate 1. A device isolation layer 3 may be formed in the semiconductor substrate 1 to define unit pixel regions UP and an active region. The device isolation layer 3 may include one or more of a silicon oxide layer, a silicon nitride layer, and a silicon oxynitride layer that are formed by, for example, an STI (Shallow Trench Isolation) process. A first mask pattern 6 may be formed on the semiconductor substrate 1. The first mask pattern 6 may serve as an ion implantation mask to roughly define planar positions of photoelectric conversion parts PD1 to PD3 and floating diffusion parts FD1 to FD3 in the semiconductor substrate 1. The first mask pattern 6 may be used to perform an ion implantation process several times such that the semiconductor substrate 1 may be provided therein with first to third impurity regions 11, 9, and 7 and first to third additional impurity regions 12, 10, and 8. In this step, first to third horizontal floating diffusion parts 11$f$, 9$f$, and 7$f$ may be formed at positions horizontally spaced apart respectively from the first to third impurity regions 11, 9, and 7. In addition, first to third horizontal separation regions 12$f$, 10$f$, and 8$f$ may also be formed at positions horizontally spaced apart respectively from the first to third additional impurity regions 12, 10, and 8. The first to third horizontal floating diffusion parts 11$f$, 9$f$, and 7$f$ may be formed simultaneously or contemporaneously with the first to third impurity regions 11, 9, and 7, respectively, and thus the same conductivity impurity may be implanted to have the same concentration and depth.

Figure 8:
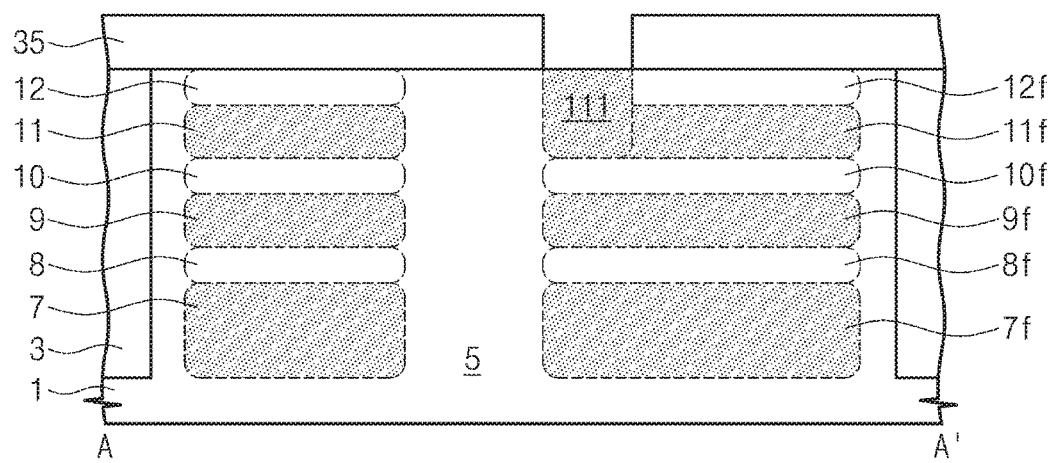

Referring to FIG. 8, the first mask pattern 6 may be removed. And then, a second mask pattern 35 may be formed on the semiconductor substrate 1. The second mask pattern 35 may define a planar position of the first floating diffusion part FD1 on a surface of the semiconductor substrate 1. An ion implantation process may be performed using the second mask pattern 35 as an ion implantation mask to form a first vertical floating diffusion part 111 in the semiconductor substrate 1. The first vertical floating diffusion part 111 may have a bottom surface positioned in the first horizontal floating diffusion part 11$f$. The first vertical floating diffusion part 111 may also have a sidewall aligned with a sidewall of the first horizontal floating diffusion part 11*f*.

Figure 9:
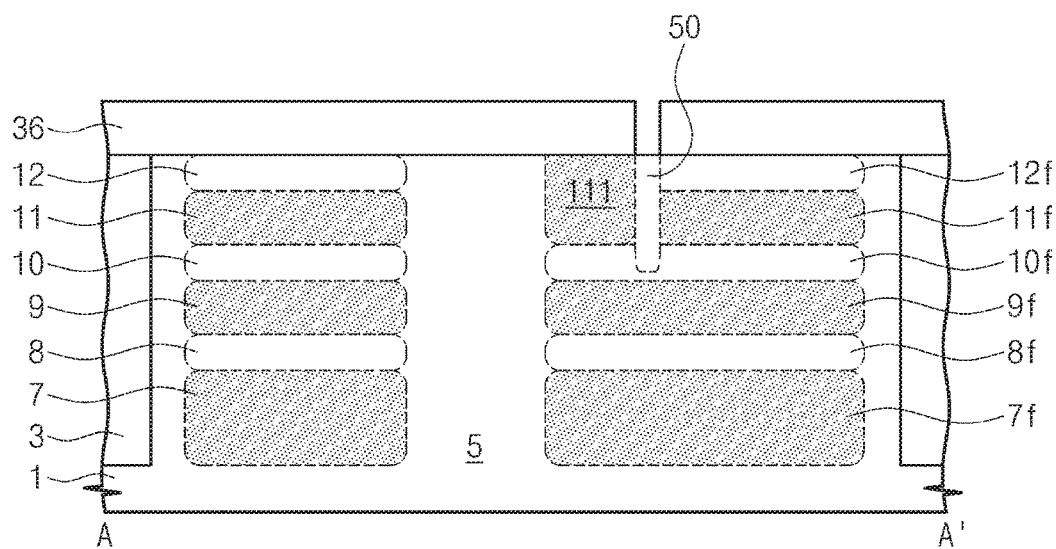

Referring to FIG. 9, the second mask pattern 35 may be removed. A third mask pattern 36 may be formed on the semiconductor substrate 1. The third mask pattern 36 may define a planar position of a first vertical separation region 50 on the surface of the semiconductor substrate 1. An ion implantation process may be performed using the third mask pattern 36 as an ion implantation mask to form the first vertical separation region 50 in the semiconductor substrate 1. The first vertical separation region 50 may have a bottom surface positioned in the second horizontal separation region 10*f*.

Figure 10:
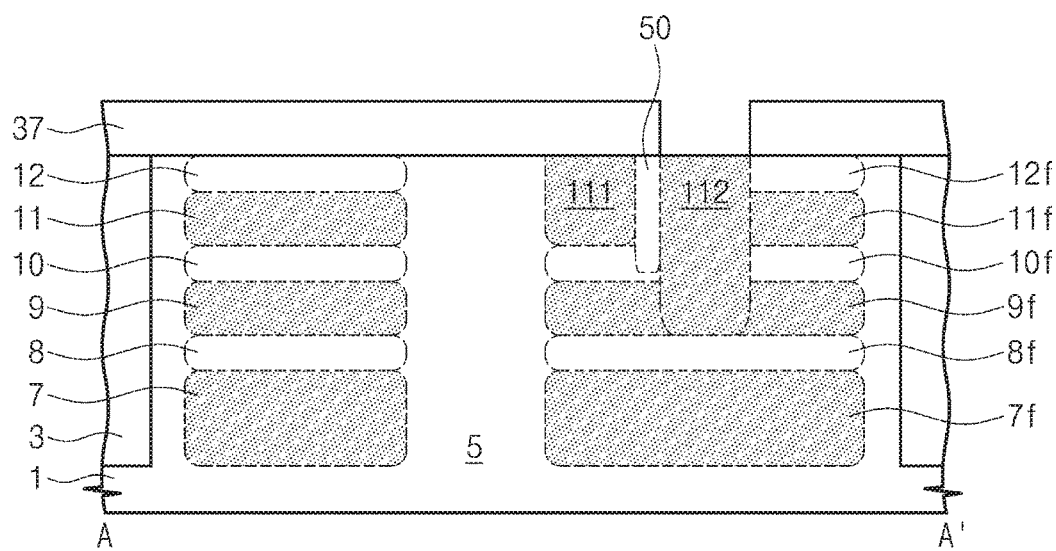

Referring to FIG. 10, the third mask pattern 36 may be removed. A fourth mask pattern 37 may be formed on the semiconductor substrate 1. The fourth mask pattern 37 may define a planar position of the second floating diffusion part FD2 on the surface of the semiconductor substrate 1. An ion implantation process may be performed using the fourth mask pattern 37 as an ion implantation mask to form a second vertical floating diffusion part 112 in the semiconductor substrate 1. The second vertical floating diffusion part 112 may have a bottom surface positioned in the second horizontal floating diffusion part 9*f*.

Figure 11:
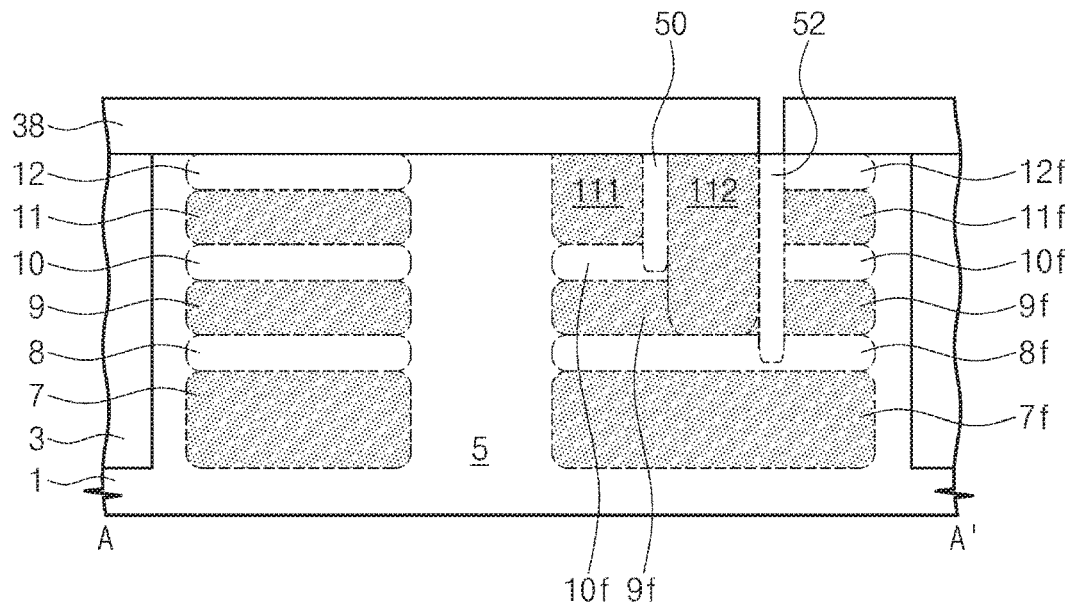

Referring to FIG. 11, the fourth mask pattern 37 may be removed. A fifth mask pattern 38 may be formed on the semiconductor substrate 1. The fifth mask pattern 38 may define a planar position of a second vertical separation region 52 on the surface of the semiconductor substrate 1. An ion implantation process may be performed using the fifth mask pattern 38 as an ion implantation mask to form the second vertical separation region 52 in the semiconductor substrate 1. The second vertical separation region 52 may have a bottom surface positioned in the third horizontal separation region 8*f*.

Figure 12:
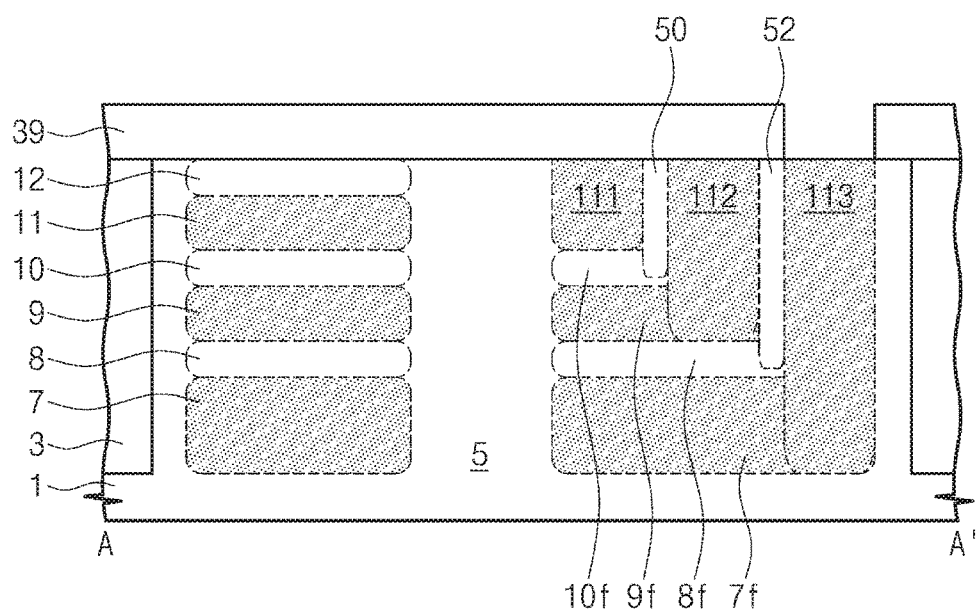

Referring to FIG. 12, the fifth mask pattern 38 may be removed. A sixth mask pattern 39 may be formed on the semiconductor substrate 1. The sixth mask pattern 39 may define a planar position of the third floating diffusion part FD3 on the surface of the semiconductor substrate 1. An ion implantation process may be performed using the sixth mask pattern 39 as an ion implantation mask to form a third vertical floating diffusion part 113 in the semiconductor substrate 1. The third vertical floating diffusion part 113 may have a bottom surface positioned in the third horizontal floating diffusion part 7*f*. The third vertical floating diffusion part 113 may also have a sidewall aligned with a sidewall of the third horizontal floating diffusion part 7*f*.

Referring back to FIGS. 1 to 4, the sixth mask pattern 39 may be removed. And then, an annealing process may be performed on the semiconductor substrate 1 to form the first to third floating diffusion parts FD1 to FD3 and first and second separation regions 51 and 53. The first horizontal and vertical floating diffusion parts 11*f* and 111 may combine with each other to constitute the first floating diffusion part FD1. The second horizontal and vertical floating diffusion parts 9*f* and 112 may combine with each other to constitute the second floating diffusion part FD2. The third horizontal and vertical floating diffusion parts 7*f* and 113 may combine with each other to constitute the third floating diffusion part FD3. The first separation region 51 may be constituted by a combination of the second horizontal separation region 10*f* and the first vertical separation region 50. The second separation region 53 may be constituted by a combination of the third horizontal separation region 8*f* and the second vertical separation region 52.

Subsequently, recesses 14 may be formed by etching the semiconductor substrate 1 between the photoelectric conversion parts PD1 to PD3 and the floating diffusion parts FD1 to FD3. A thermal oxidation process may be performed to form a gate dielectric layer 13 on surfaces of the recesses 14 and the surface of the semiconductor substrate 1. A conductive layer may be stacked to fill the recesses 14. A transfer gate TG may be formed by forming a capping pattern 15 on the conductive layer and then etching the conductive layer using the capping pattern 15 as an each mask. After that, a spacer 17 may be formed to cover a sidewall of the transfer gate TG. A first interlayer dielectric layer 19 may be formed on an entire surface of the semiconductor substrate 1. And then, other components may be formed using methods well known to those skilled in the art.

Figure 13:
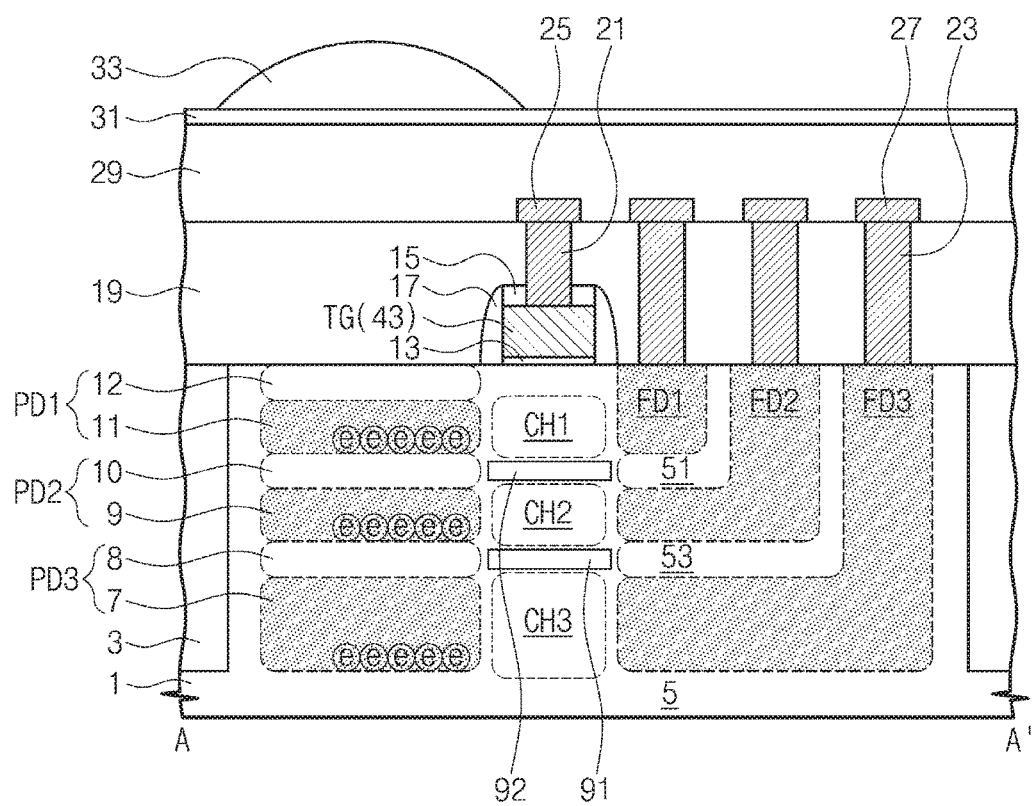
FIG. 13 is a cross-sectional view taken along line A-A' of FIG. 1 according to example embodiments of the example inventive concepts.

FIG. 13 is a cross-sectional view taken along line A-A' of FIG. 1 according to example embodiments of the example inventive concepts.

Referring to FIG. 13, an image sensor 102 may further include separation parts 91 and 92 interposed between the channel regions CH1 to CH3. The separation parts 91 and 92 may be formed of or include an insulating material such as a silicon oxide layer. Alternatively, the separation parts 91 and 92 may be a semiconductor pattern doped with an impurity having the same conductivity as the conductivity of the well region 5 and having a higher concentration than the concentration of the well region 5. The semiconductor pattern may be a polysilicon pattern. Other configurations may be identical or similar to or the same as those discussed with reference to FIGS. 1 to 4. The separation parts 91 and 92 may separate the channel regions CH1 to CH3 from each other to reduce or prevent crosstalk between information of lights having different wavelength ranges.

Figure 14:
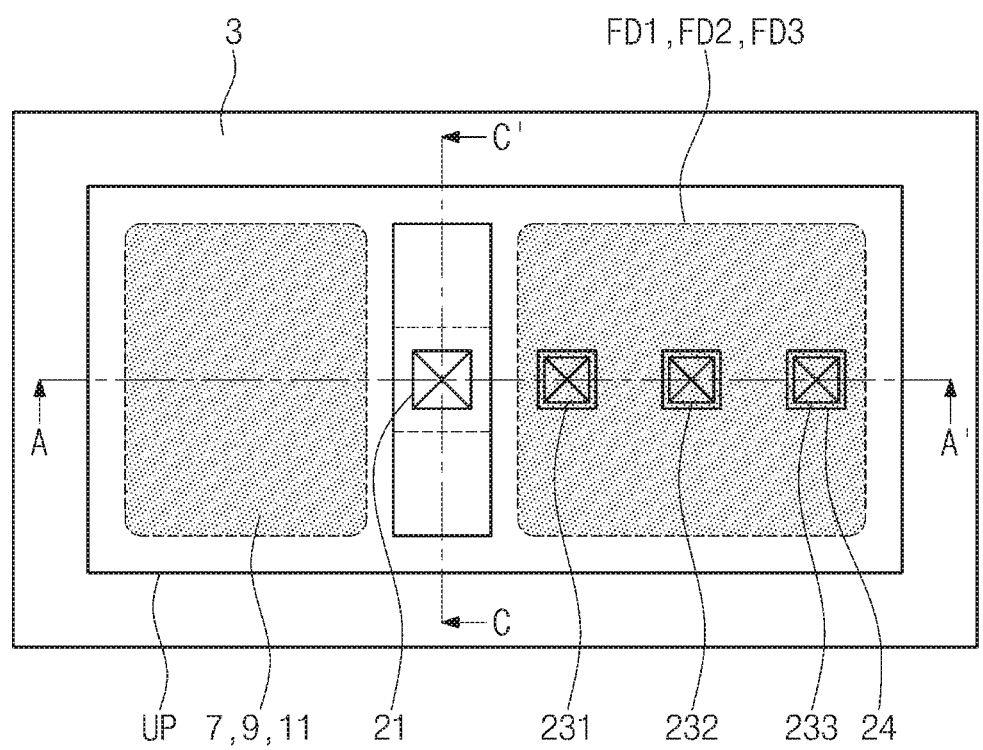
FIG. 14 is a plan view of an image sensor according to example embodiments of the example inventive concepts.
Figure 15:
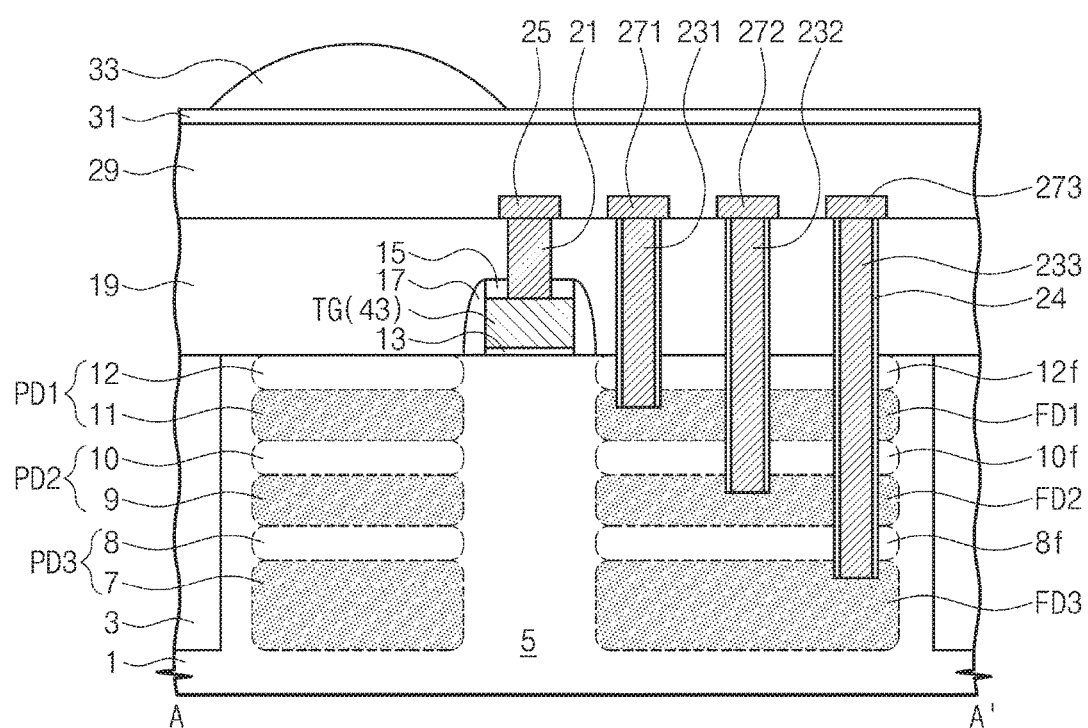
FIG. 15 is a cross-sectional view taken along line A-A' of FIG. 14.

FIG. 14 is a plan view of an image sensor according to example embodiments of the example inventive concepts. FIG. 15 is a cross-sectional view taken along line A-A' of FIG. 14.

Referring to FIGS. 14 and 15, an image sensor 103 may include the first to third floating diffusion parts FD1, FD2, and FD3 each of, or at least one of which has a straight shape without bending and is not exposed to the surface of the semiconductor substrate 1. The first horizontal separation region 12*f* may be interposed between the first floating diffusion part FD1 and the surface of the semiconductor substrate 1, and the second and third horizontal separation regions 10*f*, and 8*f* may be interposed among the first to third floating diffusion parts FD1, FD2, and FD3. The first to third floating diffusion parts FD1, FD2, and FD3 may be respectively positioned at the same depths as the first to third impurity regions 11, 9, and 7. The first floating diffusion part FD1 may be coupled to a first FD contact plug 231 that penetrates the first interlayer dielectric layer 19 and further penetrates the first horizontal separation region 12*f* in the semiconductor substrate 1. The first FD contact plug 231 may have a bottom surface positioned in the first floating diffusion part FD1. The second floating diffusion part FD2 may be coupled to a second FD contact plug 232 that penetrates the first interlayer dielectric layer 19 and further penetrates the first horizontal separation region 12*f*, the first floating diffusion part FD1, and the second horizontal separation region 10*f* that are provided in the semiconductor substrate 1. The second FD contact plug 232 may have a bottom surface positioned in the second floating diffusion part FD2. The third floating diffusion part FD3 may be coupled to a third FD contact plug 233 that penetrates the first interlayer dielectric layer 19 and further penetrates the first horizontal separation region 12*f*, the first floating diffusion part FD1, the second horizontal separation region 10f, the second floating diffusion part FD2, and the third horizontal separation region 8f that are provided in the semiconductor substrate 1. The third FD contact plug 233 may have a bottom surface positioned in the third floating diffusion part FD3. The FD contact plugs 231, 232, and 233 may their side surfaces that are all covered with an insulation layer 24 so that the FD contact plugs 231, 232, and 233 may be insulated from surrounding regions. First to third FD lines 271, 272, and 273 may be disposed respectively on the first to third FD contact plugs 231, 232, and 233. The first FD contact plug 231 may be disposed closest to the transfer gate TG, the third FD contact plug 233 may be disposed farthest to the transfer gate TG, and the second FD contact plug 232 may be disposed between the first and third FD contact plugs 231 and 233.

Other configurations may be identical or similar to or the same as those discussed with reference to FIGS. 1 to 5. A cross-section obtained by cutting FIG. 4 along line C-C' may correspond to FIG. 4.

The image sensor 103 of FIG. 15 may be fabricated by forming impurity regions as shown FIG. 7 and then forming the FD contact plugs 231, 232, and 233 at different depths. As such, the image sensor 103 may be simply fabricated.

Figure 16:
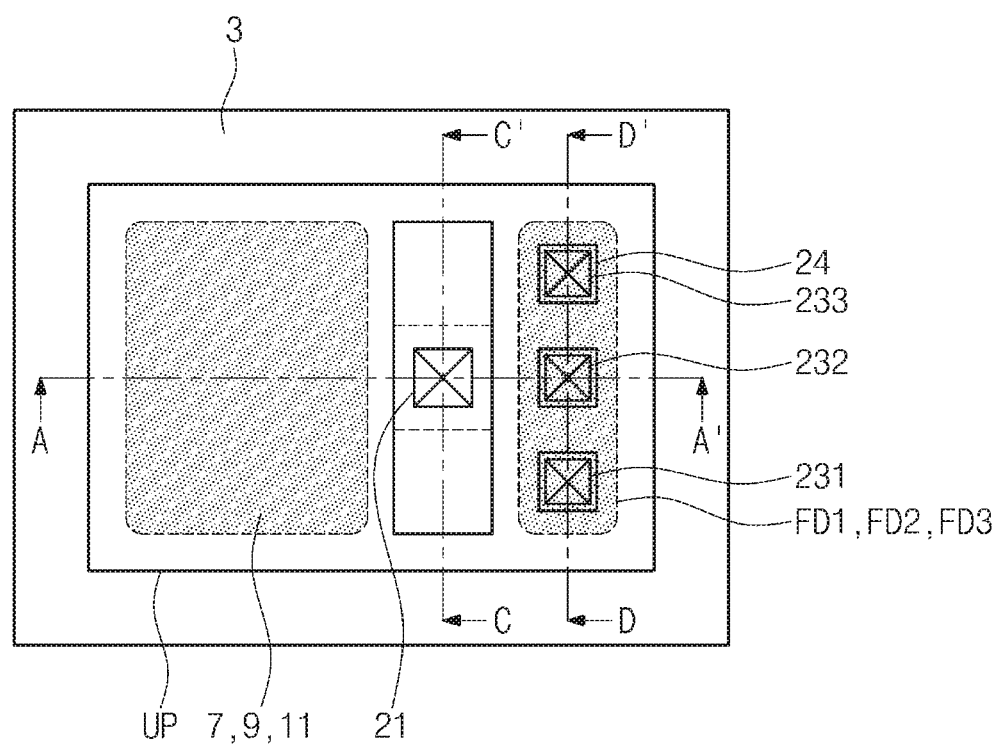
FIG. 16 is a plan view of an image sensor according to example embodiments of the example inventive concepts.
Figure 17:
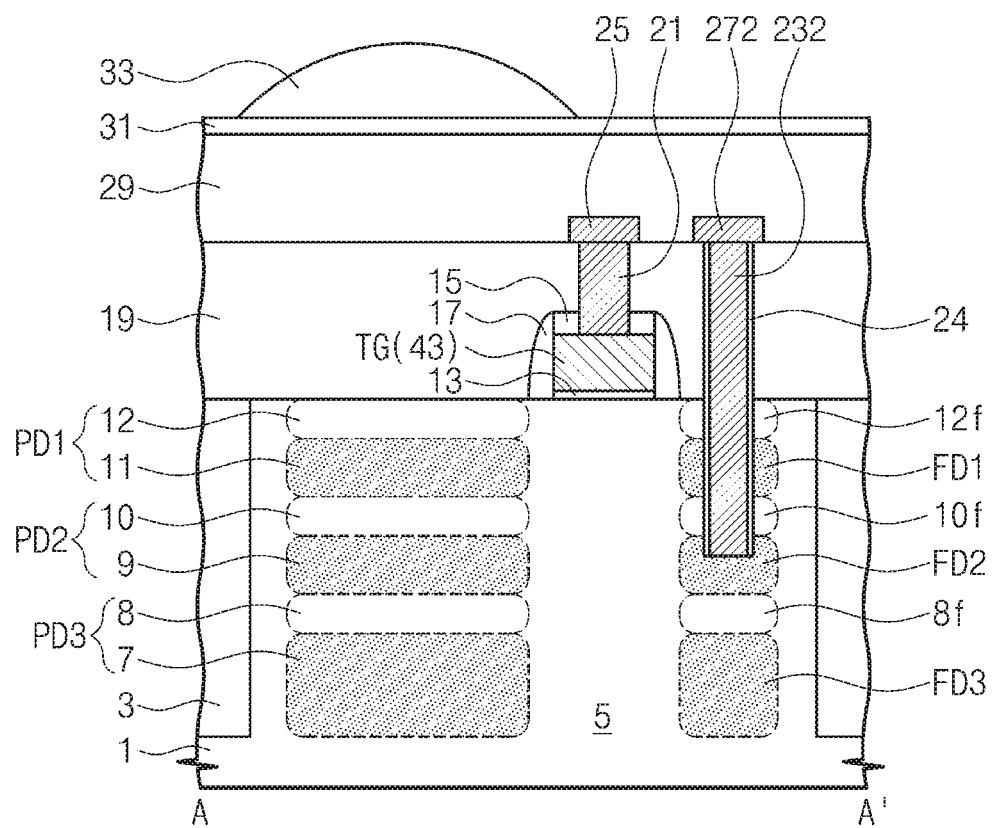
FIG. 17 is a cross-sectional view taken along line A-A' of FIG. 16.
Figure 18:
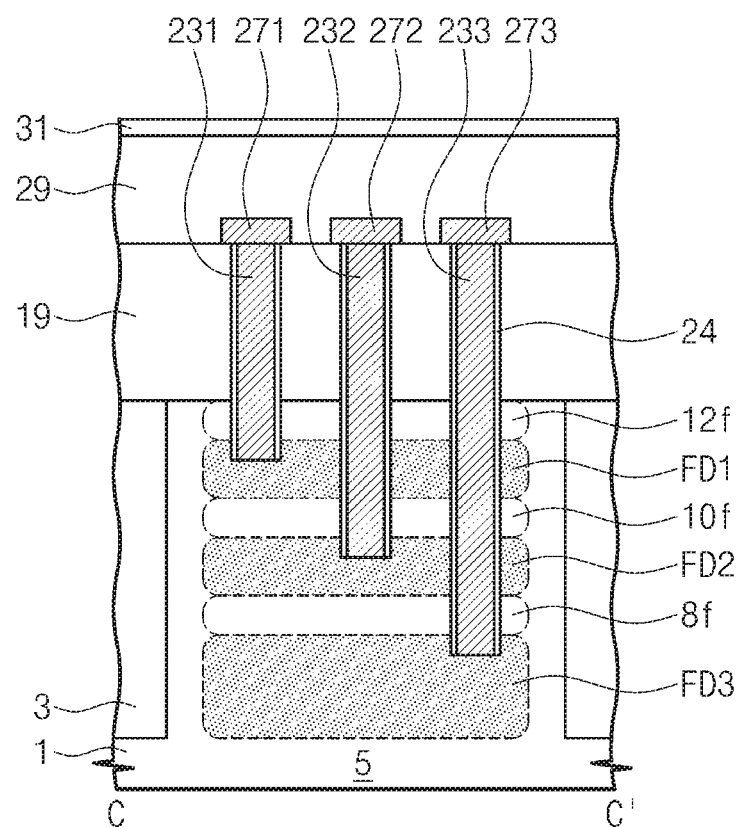
FIG. 18 is a cross-sectional view taken along line D-D' of FIG. 16.

FIG. 16 is a plan view of an image sensor according to example embodiments of the example inventive concepts. FIG. 17 is a cross-sectional view taken along line A-A' of FIG. 16. FIG. 18 is a cross-sectional view taken along line D-D' of FIG. 16. A cross-section obtained by cutting FIG. 4 along line C-C' may correspond to FIG. 4.

Referring to FIGS. 16 to 18, an image sensor 104 may include the FD contact plugs 231, 232, and 233 and the FD lines 271, 272, and 273 all of which are disposed nearby the transfer gate TG. For example, the image sensor 104 may be configured such that the FD contact plugs 231, 232, and 233 may be equally spaced apart from the transfer gate TG. The FD contact plugs 231, 232, and 233 may be disposed at a regular interval along a sidewall of the transfer gate TG. Other configurations may be identical or similar to or the same as those discussed with reference to FIGS. 14 and 15. As the image sensor 104 is fabricated to include the FD contact plugs 231, 232, and 233 densely formed on a limited area, it may be possible to reduce an area occupied by the unit pixel region UP and to achieve high integration.

Figure 19:
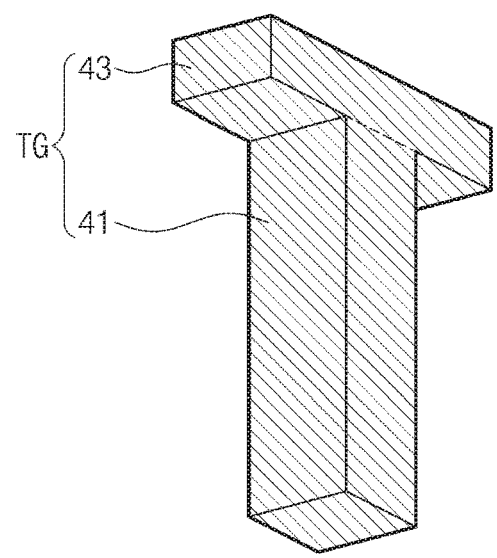
FIGS. 19 and 20 are perspective views of transfer gates according to example embodiments of the example inventive concepts.
Figure 20:
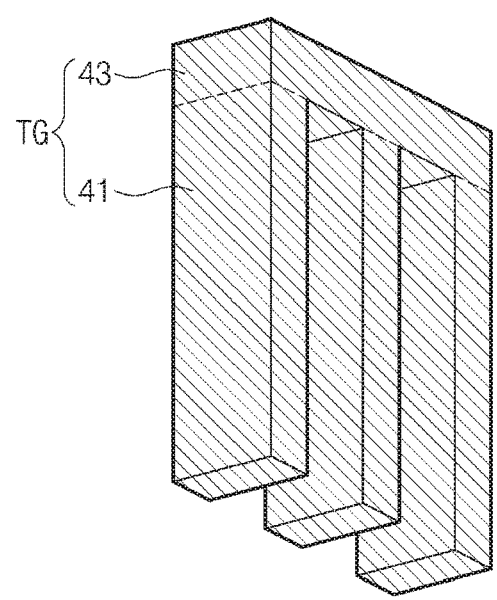

FIGS. 19 and 20 are perspective views of transfer gates TG according to example embodiments of the example inventive concepts.

Referring to FIGS. 19 and 20, the transfer gate TG may include two gate buried portions 41 as discussed above, a single gate buried portion 41 as shown in FIG. 19, or three gate buried portions 41 as shown in FIG. 20. The number of the gate buried portions 41 may be four or more.

Figure 21:
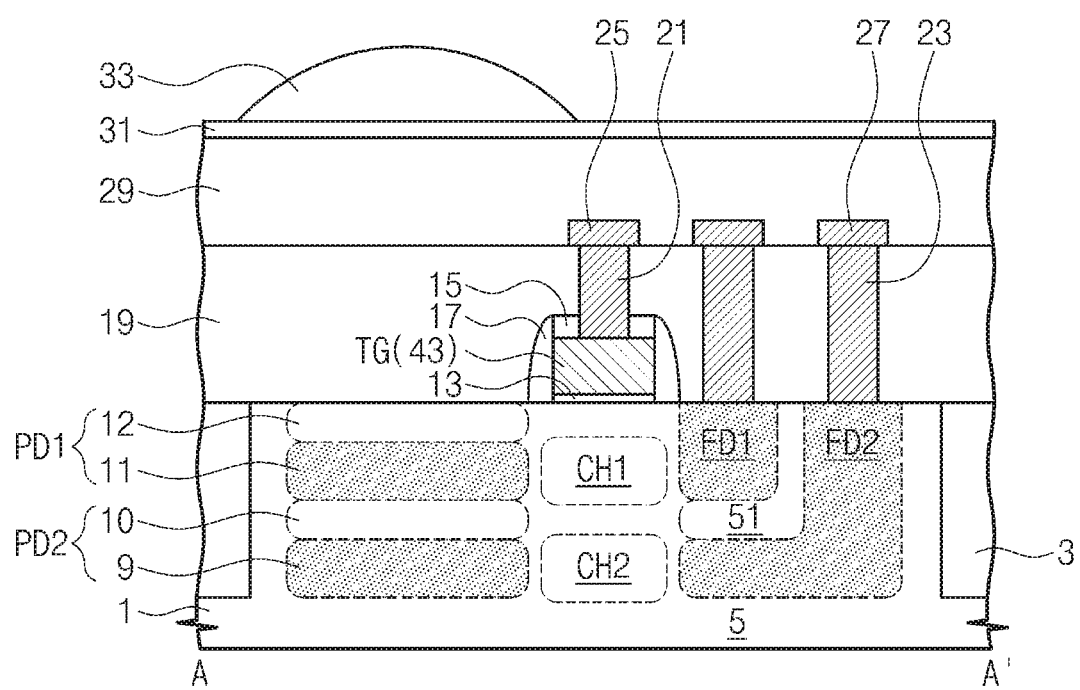
FIGS. 21 and 22 are cross-sectional views of an image sensor according to example embodiments of the example inventive concepts.
Figure 22:
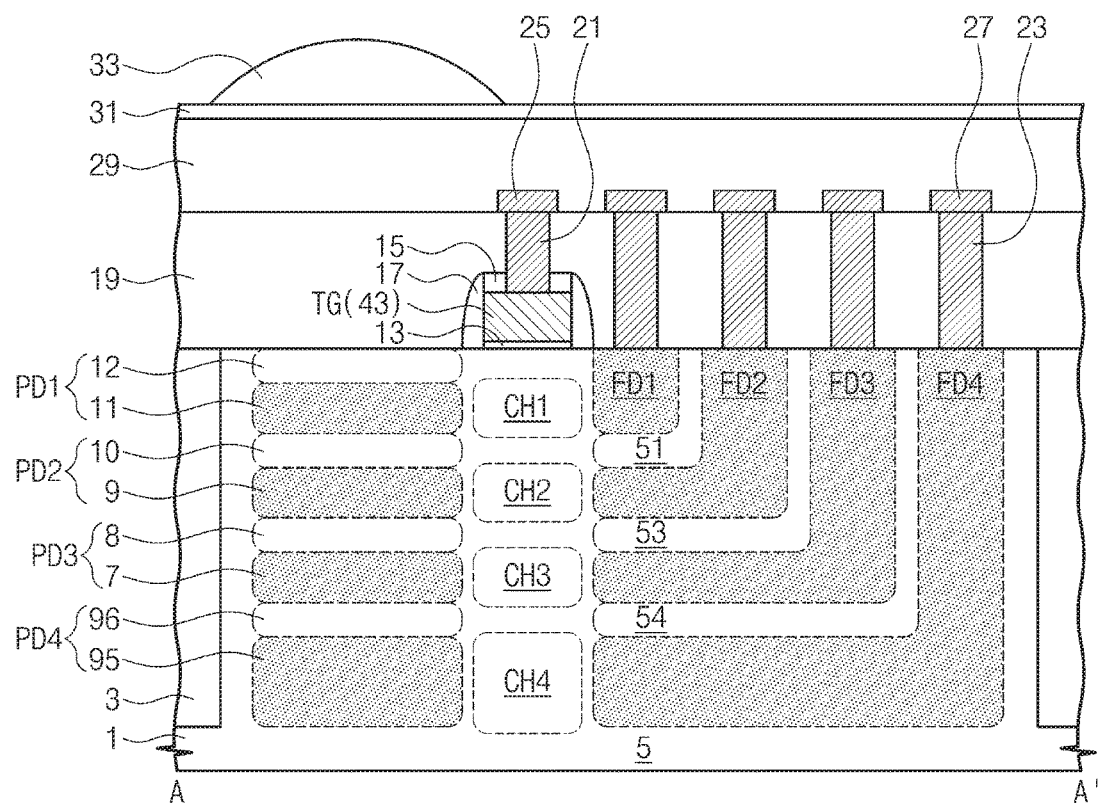

FIGS. 21 and 22 are cross-sectional views of an image sensor according to example embodiments of the example inventive concepts.

Referring to FIGS. 21 and 22, the photoelectric conversion parts PD1 to PD3 may have a two-story structure such like FIG. 21 or a four-story structure such like FIG. 22 besides the three-story structure discussed above. When two photoelectric conversion parts PD1 and PD2 are provided as shown in FIG. 21, it may also be provided two floating diffusion parts FD1 and FD2 positioned at heights corresponding to those of the two photoelectric conversion parts PD1 and PD2. When four photoelectric conversion parts PD1 to PD4 are provided as shown in FIG. 22, it may also be provided four floating diffusion parts FD1 to FD4 positioned at heights corresponding to those of the four photoelectric conversion parts PD1 to PD4. In particular to FIG. 22, a fourth photoelectric conversion part PD4 may be disposed at penetration depth of infrared light in such a way that it may be possible to sense infrared light.

Figure 23:
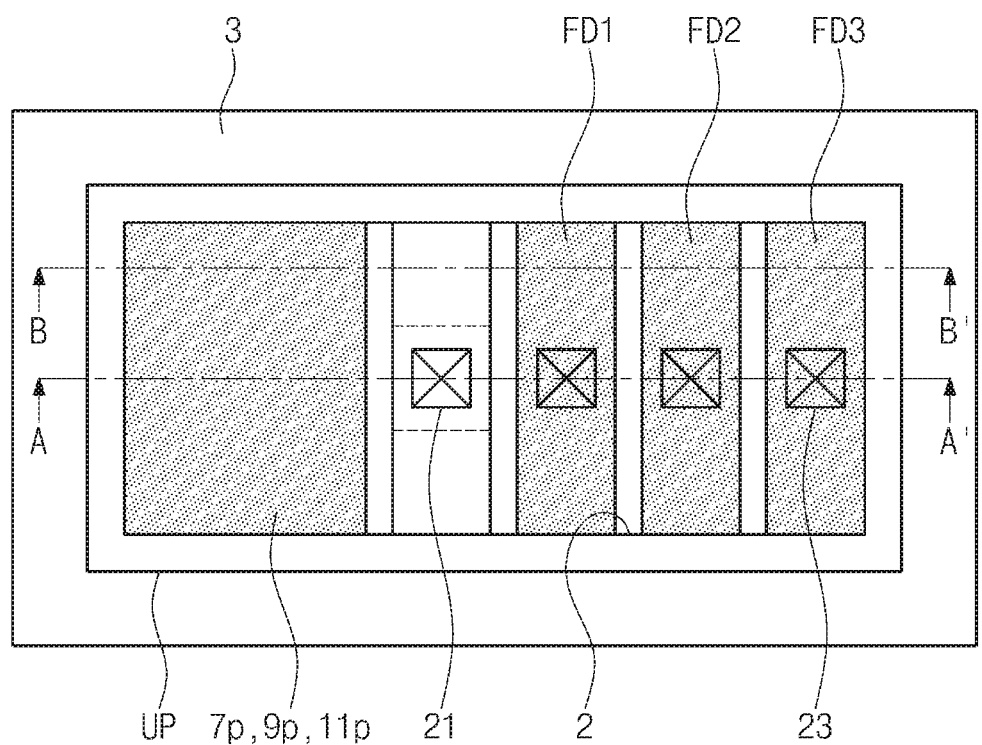
FIG. 23 is a plan view of an image sensor according to example embodiments of the example inventive concepts.
Figure 24:
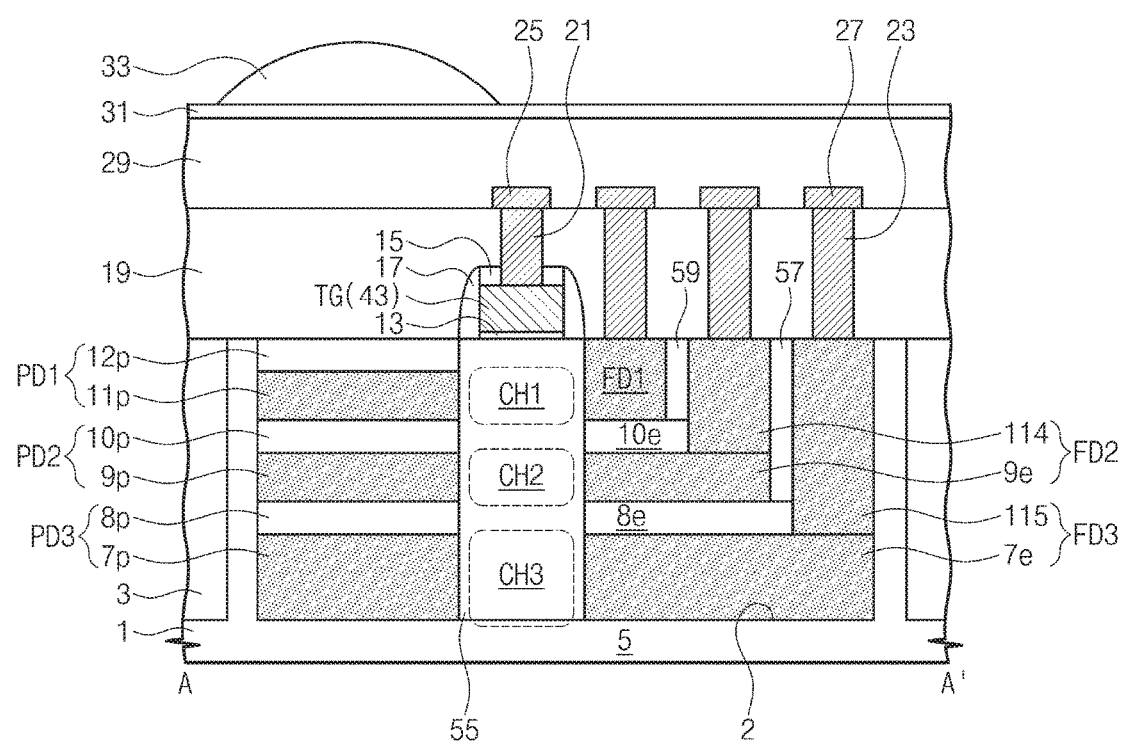
FIG. 24 is a cross-sectional view taken along line A-A' of FIG. 23 according to example embodiments of the example inventive concepts.
Figure 25:
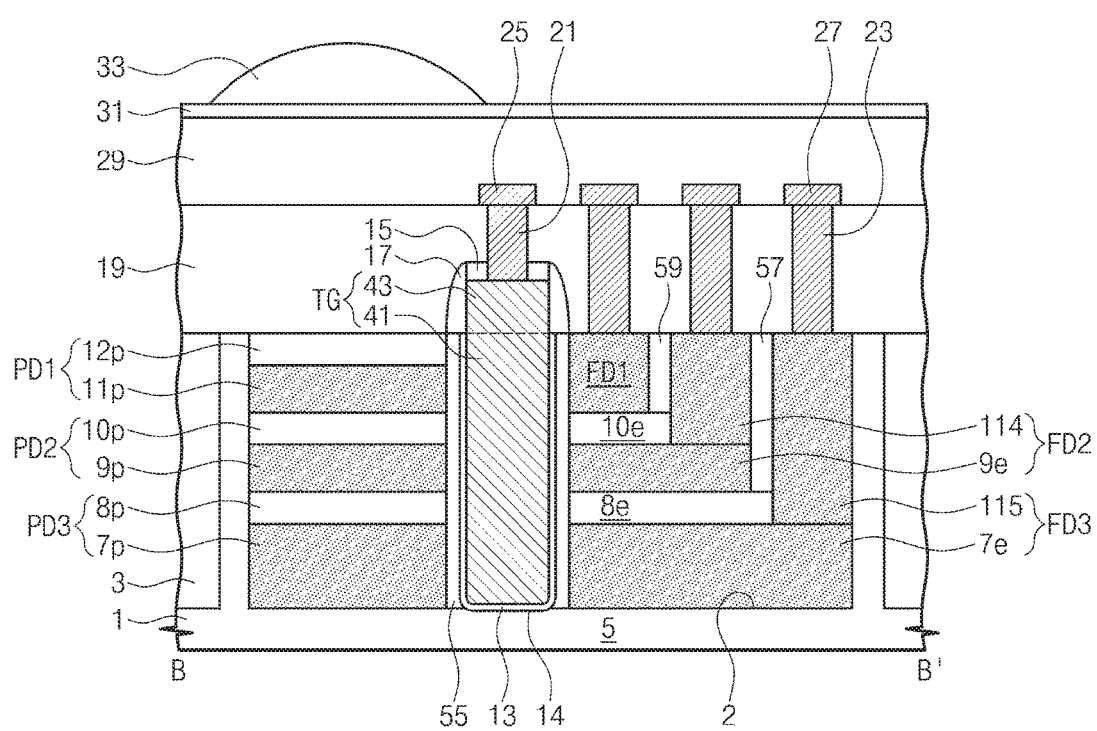
FIG. 25 is a cross-sectional view taken along line B-B' of FIG. 23 according to example embodiments of the example inventive concepts.

FIG. 23 is a plan view of an image sensor according to example embodiments of the example inventive concepts. FIG. 24 is a cross-sectional view taken along line A-A' of FIG. 23 according to example embodiments of the example inventive concepts. FIG. 25 is a cross-sectional view taken along line B-B' of FIG. 23 according to example embodiments of the example inventive concepts.

Referring to FIGS. 23 to 25, an image sensor 105 may include the photoelectric conversion parts PD1 to PD3 and the floating diffusion parts FD1 to FD3 that are composed not of impurity regions but of impurity-doped semiconductor patterns. The semiconductor patterns may include, for example, a polysilicon layer or a silicon germanium layer. The semiconductor substrate 1 may be provided therein with a trench 2 having therein the photoelectric conversion parts PD1 to PD3 and the floating diffusion parts FD1 to FD3 composed of the semiconductor patterns. In detail, the first photoelectric conversion part PD1 may include a first impurity pattern 11p and a first additional impurity pattern 12p. The second photoelectric conversion part PD2 may include a second impurity pattern 9p and a second additional impurity pattern 10p. The third photoelectric conversion part PD3 may include a third impurity pattern 7p and a third additional impurity pattern 8p. The second floating diffusion part FD2 may include a second horizontal floating diffusion part 9e and a second vertical floating diffusion part 114. The third floating diffusion part FD3 may include a third horizontal floating diffusion part 7e and a third vertical floating diffusion part 115. A first horizontal separation region 10e and a first vertical separation region 59 may insulate the first floating diffusion part FD1 from the second floating diffusion part FD2. A second horizontal separation region 8e and a second vertical separation region 57 may insulate the third floating diffusion part FD3 from the second floating diffusion part FD2.

A channel semiconductor pattern 55 may be disposed between the photoelectric conversion parts PD1 to PD3 and the floating diffusion parts FD1 to FD3. The gate buried portion 41 may be disposed in the channel semiconductor pattern 55. When a voltage is applied to the transfer gate TG, first to third channel regions CH1, CH2, and CH3 may be generated in the channel semiconductor pattern 55.

The channel semiconductor pattern 55, the first additional impurity pattern 12p, the second additional impurity pattern 10p, the third additional impurity pattern 8p, the first horizontal separation region 10e, the second horizontal separation region 8e, the first vertical separation region 59, and the second vertical separation region 57 may be formed of or include a polysilicon pattern doped with a P-type impurity such as boron, or at least one of the patterns and regions described above may be formed of or include an insulation layer. The first impurity pattern 11p, the second impurity pattern 9p, the third impurity pattern 7p, and the first to third floating diffusion parts FD1 to FD3 may be formed of or include a polysilicon pattern doped with an N-type impurity such as phosphorus or arsenic. Other configurations may be identical or similar to or the same as those discussed with reference to FIGS. 1 to 4.

The impurity-doped semiconductor patterns PD1, PD2, PD3, FD1, FD2, FD3, and 55 may be formed by depositing and etching semiconductor layers. An impurity may be in-situ doped into the semiconductor layer during its deposition, or subsequently doped into the semiconductor layer after its deposition.

Figure 26:
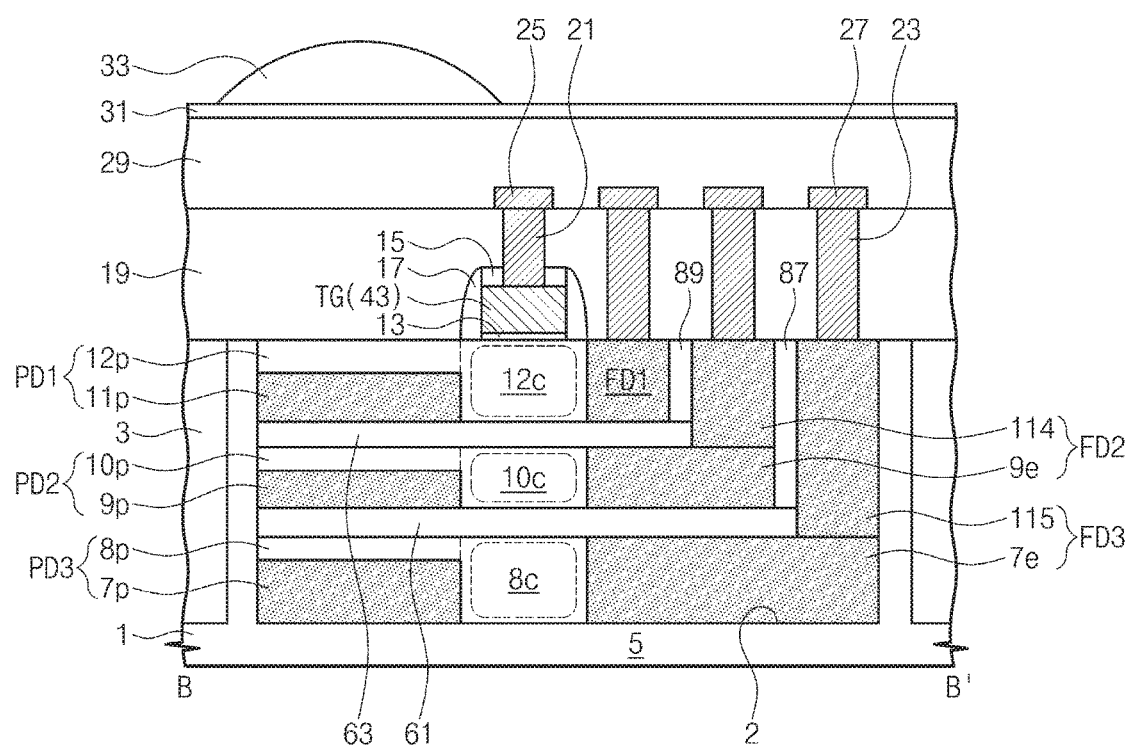
FIG. 26 is a cross-sectional view taken along line A-A' of FIG. 23 according to example embodiments of the example inventive concepts.
Figure 27:
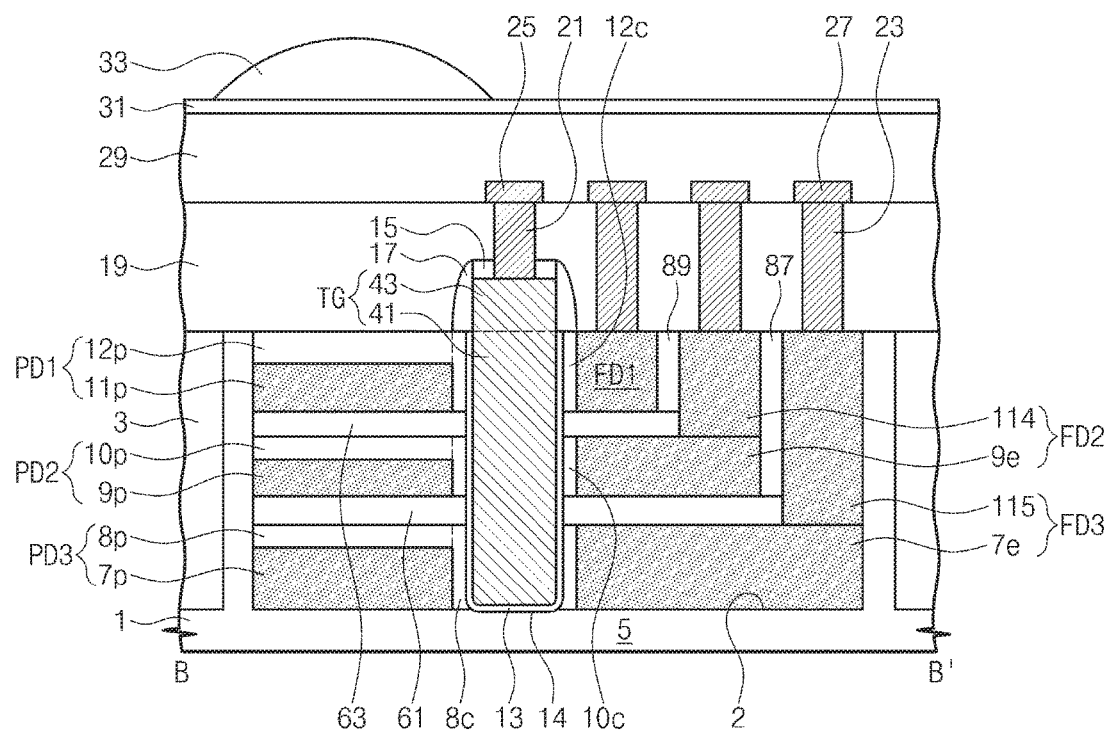
FIG. 27 is a cross-sectional view taken along line B-B' of FIG. 23 according to example embodiments of the example inventive concepts.

FIG. 26 is a cross-sectional view taken along line A-A' of FIG. 23 according to example embodiments of the example inventive concepts. FIG. 27 is a cross-sectional view taken along line B-B' of FIG. 23 according to example embodiments of the example inventive concepts.

Referring to FIGS. 26 and 27, an image sensor 106 may further include: a first insulating separation region 63 interposed between the first floating diffusion part FD1 and the second horizontal floating diffusion part 9e; and a second insulating separation region 61 interposed between the second horizontal floating diffusion part 9e and the third horizontal floating diffusion part 7e. The first and second insulating separation regions 63 and 61 may run across the channel semiconductor pattern 55 such that first to third sub-channel semiconductor patterns 12c, 10c, and 8c may be branched from the channel semiconductor pattern 55. The photoelectric conversion parts PD1 to PD3 may be electrically insulated from each other by the first and second insulating separation regions 63 and 61 extending therebetween. The gate buried portion 41 may penetrate the sub-channel semiconductor patterns 12c, 10c, and 8c and further penetrate the first and second insulating separation regions 63 and 61. The first sub-channel semiconductor pattern 12c and the first additional impurity pattern 12p may be composed of the same semiconductor pattern. The second sub-channel semiconductor pattern 10c and the second additional impurity pattern 10p may be composed of the same semiconductor pattern. The third sub-channel semiconductor pattern 8c and the third additional impurity pattern 8p may be composed of the same semiconductor pattern.

The image sensor 106 may further include: a first vertical separation region 89 interposed between the first floating diffusion part FD1 and the second vertical floating diffusion part 114; and a second vertical separation region 87 interposed between the second vertical floating diffusion part 114 and the third vertical floating diffusion part 115. The first and second insulating separation regions 63 and 61 and the first and second vertical separation regions 89 and 87 may be formed of or include an insulating material. Other configurations may be identical or similar to or the same as those discussed with reference to FIGS. 23 to 25.

In image sensors according to embodiments of the example inventive concepts, a single unit pixel region may include multi-layered channel regions generated by multi-layered photoelectric conversion parts and floating diffusion parts at heights corresponding to those of the photoelectric conversion parts. A single pixel may thus simultaneously or contemporaneously sense lights having various wavelength ranges. In addition, a single transfer gate protruding into a substrate may be used to concurrently transfer light signals of various wavelength ranges, thereby enhancing operating speed and enabling high integration.

It has been discussed above structures of image sensors and method of fabricating the same according to example embodiments of the example inventive concepts. The example inventive concepts is not limited thereto. The structures and fabrication methods may be combined with each other.

What is claimed is:

1. An image sensor, comprising:
a transfer gate including a gate buried portion extending into a semiconductor substrate from a surface of the semiconductor substrate;
a plurality of photoelectric conversion parts in the semiconductor substrate on a side of the gate buried portion and overlapping each other in a direction perpendicular to the surface of the semiconductor substrate; and
a plurality of floating diffusion parts spaced apart from and overlapping each other in the semiconductor substrate on an other side of the gate buried portion in the direction perpendicular to the surface of the semiconductor substrate,
the floating diffusion parts being at a height of corresponding photoelectric conversion parts;
at least one of the photoelectric conversion parts includes a first impurity region and a second impurity region on the first impurity region, and
at least one of the floating diffusion parts has a bottom surface at the same height as a bottom surface of the first impurity region included in the at least one of the photoelectric conversion parts.

2. The image sensor of claim 1, wherein the floating diffusion parts comprise:
a first floating diffusion part adjacent to the surface of the semiconductor substrate; and
a second floating diffusion part below and spaced apart from the first floating diffusion part;
the second floating diffusion part having an L-shaped cross-section extending to the surface of the semiconductor substrate.

3. The image sensor of claim 1, wherein the gate buried portion extends between a lowermost floating diffusion part and a lowermost photoelectric conversion part.

4. The image sensor of claim 1, wherein, in the semiconductor substrate, a number of the first impurity regions of the photoelectric conversion parts is the same as a number of the floating diffusion parts.

5. The image sensor of claim 1, further comprising:
a plurality of channel regions apart from and overlapping each other between the photoelectric conversion parts and the floating diffusion parts in the direction perpendicular to the surface of the semiconductor substrate; and
at least one separation part between the channel regions, wherein the separation part includes an insulation layer or a semiconductor pattern doped with an impurity, a conductivity of which is opposite to a conductivity of one of the floating diffusion parts.

6. The image sensor of claim 1, wherein the at least one of the photoelectric conversion parts and the at least one of the floating diffusion parts comprises one of a region including an impurity implanted into the semiconductor substrate and an impurity-doped semiconductor pattern in the semiconductor substrate.

7. The image sensor of claim 1, further comprising:
a plurality of contact plugs on the semiconductor substrate and connected to corresponding floating diffusion parts; and
an insulation layer surrounding a side surface of at least one of the contact plugs,
wherein the floating diffusion parts have a plate shape in the semiconductor substrate, and
wherein the contact plugs penetrate a portion of the semiconductor substrate, at least one of the contact plugs having a bottom surface in a corresponding one of the floating diffusion parts.

8. The image sensor of claim 7, wherein the contact plugs are along a side surface of the transfer gate and evenly spaced apart from the side surface of the transfer gate.

9. The image sensor of claim 1, further comprising at least one separation part between the floating diffusion parts.

10. The image sensor of claim 9, wherein the separation part extends between the photoelectric conversion parts.

11. The image sensor of claim 9, wherein the separation part comprises an insulation layer or one of a region and a semiconductor pattern doped with an impurity, a conductivity of which is different from a conductivity of an impurity doped in one of the floating diffusion parts.

12. The image sensor of claim 1, further comprising:
a channel part adjacent to the gate buried portion and between the photoelectric conversion parts and the floating diffusion parts,
wherein the channel part includes a channel semiconductor pattern in which the gate buried portion is located and is doped with an impurity.

13. The image sensor of claim 12, wherein each of the photoelectric conversion parts comprises:
a first semiconductor pattern doped with a first impurity having a first conductivity; and
a second semiconductor pattern on the first semiconductor pattern and doped with a second impurity having a second conductivity opposite to the first conductivity, wherein the second semiconductor pattern and the channel semiconductor pattern are integral with each other.

14. The image sensor of claim 13, further comprising:
at least one insulation layer between the floating diffusion parts and extending between the photoelectric conversion parts,
wherein the at least one insulation layer divides the channel semiconductor pattern into a plurality of sub-channel semiconductor patterns, and
wherein the gate buried portion penetrates the sub-channel semiconductor patterns and the at least one insulation layer.

15. An image sensor, comprising:
a semiconductor substrate;
a transfer gate on the semiconductor substrate;
a plurality of photoelectric conversion parts in the semiconductor substrate, the plurality of photoelectric conversion parts overlapping each other in a first direction perpendicular to a surface of the semiconductor substrate;
a plurality of floating diffusion parts spaced apart from and overlapping each other in the semiconductor substrate in the first direction; and
a plurality of channel regions between the plurality of floating diffusion parts and the plurality of photoelectric conversion parts;
the transfer gate overlapping the channel regions in the first direction;
at least one of the photoelectric conversion parts includes a first impurity region and a second impurity region on the first impurity region, and
at least one of the floating diffusion parts has a bottom surface at the same height as a bottom surface of the first impurity region included in the at least one of the photoelectric conversion parts.

16. The image sensor of claim 15, wherein the floating diffusion parts are at a height of corresponding photoelectric conversion parts.

17. The image sensor of claim 15, wherein the transfer gate includes a gate buried portion extending into the semiconductor substrate from the surface of the semiconductor substrate.

18. The image sensor of claim 17, wherein the plurality of photoelectric conversion parts in the semiconductor substrate are on a side of the gate buried portion.

19. The image sensor of claim 18, wherein the plurality of floating diffusion parts are on another side of the gate buried portion.

* * * * *